United States Patent
Sheen et al.

(10) Patent No.: US 7,687,371 B2
(45) Date of Patent: Mar. 30, 2010

(54) METHOD OF FORMING ISOLATION STRUCTURE OF SEMICONDUCTOR DEVICE FOR PREVENTING EXCESSIVE LOSS DURING RECESS GATE FORMATION

(75) Inventors: Dong Sun Sheen, Kyoungki-do (KR); Seok Pyo Song, Seoul (KR); Sang Tae Ahn, Kyoungki-do (KR); Hyeon Ju An, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 13 days.

(21) Appl. No.: 12/243,133

(22) Filed: Oct. 1, 2008

(65) Prior Publication Data

US 2009/0029521 A1 Jan. 29, 2009

Related U.S. Application Data

(62) Division of application No. 11/647,764, filed on Dec. 29, 2006, now Pat. No. 7,501,687.

(30) Foreign Application Priority Data

Jun. 30, 2006 (KR) ...................... 10-2006-0061369

(51) Int. Cl.
*H01L 21/76* (2006.01)

(52) U.S. Cl. .............................. 438/424; 257/E21.585; 257/396; 438/435

(58) Field of Classification Search ................. 257/499, 257/501; 438/424
See application file for complete search history.

(56) References Cited

U.S. PATENT DOCUMENTS

| 6,566,229 B2* | 5/2003 | Hong et al. | 438/435 |
| 6,593,207 B2* | 7/2003 | Hong et al. | 438/424 |
| 2002/0127817 A1* | 9/2002 | Heo et al. | 438/424 |

* cited by examiner

*Primary Examiner*—Fernando L Toledo
*Assistant Examiner*—Mamadou Diallo
(74) *Attorney, Agent, or Firm*—Ladas & Parry LLP

(57) ABSTRACT

An isolation structure of a semiconductor device is formed by forming a hard mask layer on a semiconductor substrate having active and field regions to expose the field region. A trench is defined by etching the exposed field region of the semiconductor substrate using the hard mask as an etch mask. An SOG layer is formed in the trench partially filling the trench. An amorphous aluminum oxide layer is formed on the resultant substrate including the SOG layer. An HDP layer is formed on the amorphous aluminum oxide layer to completely fill the trench. The HDP layer and the amorphous aluminum oxide layer are subjected to CMP to expose the hard mask. The hard mask and portions of the amorphous aluminum oxide layer that are formed on the HDP layer are removed. The amorphous aluminum oxide layer is crystallized.

16 Claims, 9 Drawing Sheets

METHOD OF FORMING ISOLATION STRUCTURE OF SEMICONDUCTOR DEVICE FOR PREVENTING EXCESSIVE LOSS DURING RECESS GATE FORMATION

CROSS-REFERENCE TO RELATED APPLICATIONS

The present application claims priority to Korean patent application number 10-2006-0061369 filed on Jun. 30, 2006, which is incorporated by reference in its entirety.

BACKGROUND OF THE INVENTION

The present invention relates to a method for forming an isolation structure of a semiconductor device, and more particularly, to a method for forming an isolation structure of a semiconductor device that can prevent an excessive loss of an isolation structure when forming a recess gate.

As semiconductor devices become more highly integrated, trench filling when forming an isolation structure for defining an active region has become a difficult issue. A method has been disclosed in the art for this situation in which a spin-on glass layer (hereinafter referred to as an "SOG layer"), with an excellent gap filling characteristic, is first deposited in the trench, and a high-density plasma-chemical vapor layer (hereinafter referred to as an "HDP layer") is deposited on the SOG layer, such that the trench is filled by the stacked layer of the SOG layer and the HDP layer.

In this method, because the SOG layer with the excellent gap-fill characteristic fills a high percentage of the lower trench, it may be possible to prevent the formation of a void when completely filling the trench. Also, in this method, because the upper portion of the trench is filled by the HDP layer having a relatively slow etching speed, it may be possible to prevent the isolation structure from being damaged when subsequently conducting a cleaning process and an etching process.

Hereafter, a conventional method for forming an isolation structure of a semiconductor device will be described with reference to FIGS. 1A through 1D.

Referring to FIG. 1A, a buffer oxide layer 112 and a pad nitride layer 114 are sequentially formed on a semiconductor substrate 100 having an active region and a field region. By etching the pad nitride layer 114 and the buffer oxide layer 112, a hard mask 116, which comprises a stacked layer of the buffer oxide layer 112 and the pad nitride layer 114 and exposes the field region of the semiconductor substrate 100, is formed.

Referring to FIG. 1B, the exposed field region of the semiconductor substrate 100 is etched using the hard mask 116 as an etch mask, thereby defining a trench T. By conducting a thermal oxidation process, a wall oxide layer 122 is formed on the surface of the trench T. A liner nitride layer 124 is formed on the hard mask 116 including the wall oxide layer 122.

Referring to FIG. 1C, after an SOG layer 132 is deposited on the liner nitride layer 124, the deposited SOG layer 132 is etched back such that it remains only on the lower portion of the trench T.

Referring to FIG. 1D, an HDP layer 134 is deposited on the liner nitride layer 124 including the remaining SOG layer 132 to completely fill the trench T. The HDP layer 134 is subjected to chemical mechanical polishing (CMP) to expose the hard mask 116. By removing the hard mask 116, an isolation structure 140 is formed in which the trench T is filled with the stacked layer of the SOG layer 132 and the HDP layer 134.

Meanwhile, when manufacturing a sub-100 nm semiconductor device, in order to secure an effective channel length, a method of forming a recess gate is adopted. The recess gate is formed by defining a groove by etching a gate forming area on an active region of the semiconductor substrate, depositing a gate material on the semiconductor substrate including the groove, and etching the gate material.

However, in the conventional art, when conducting the etching process for defining the groove for the formation of the recess gate, as shown in FIG. 2, an undesired loss A is caused in the isolation structure 140 (see FIGS. 1D and 2). When the loss A is caused in the isolation structure 140 in this way, a short circuit occurs between adjoining gates, the threshold voltage decreases, and gate induced drain leakage (GIDL) increases. Further, if the loss A is caused in the isolation structure 140, the area of the isolation structure 140 which adjoins a gate increases, and parasitic capacitance also increases, whereby the operation characteristics of a semiconductor device are deteriorated, and yield decreases.

The loss of the isolation structure caused when forming a recess gate can be mitigated to some extent by increasing the deposition thickness of the HDP layer, which has a relatively slower etching speed than the SOG layer. Nevertheless, as the depth to which the HDP layer is to fill the trench increases, trench filling becomes more difficult. Consequently, as shown in FIG. 3, a void V is likely to form in the trench T. Therefore, increasing the deposition thickness of the HDP layer lacks practicality since a number of other problems are caused.

SUMMARY OF THE INVENTION

The embodiments of the present invention is directed to a method for forming an isolation structure of a semiconductor device that can prevent the excessive loss of the isolation structure when subsequently forming a recess gate.

Also, the embodiment of the present invention is directed to a method for forming an isolation structure of a semiconductor device that can prevent GIDL and parasitic capacitance from increasing due to the excessive loss of the isolation structure.

Further, the embodiment of the present invention is directed to a method for forming an isolation structure of a semiconductor device that can prevent the operation characteristics of a semiconductor device from deteriorating and yield from decreasing due to an increase in GIDL and parasitic capacitance.

In one embodiment, there is provided a method for forming an isolation structure of a semiconductor device, the isolation structure delimiting an active region and formed by filling insulation layers in a trench, wherein the isolation structure comprises a triple layer composed of an SOG layer formed within the range of not completely filling the trench, an aluminum oxide layer formed on the SOG layer, and an HDP layer formed on the aluminum oxide layer to completely fill the trench.

The aluminum oxide layer comprises a crystalline aluminum oxide layer.

The SOG layer is formed to a thickness corresponding to 50~90% of the depth of the trench.

The aluminum oxide layer is formed to a thickness corresponding to 1~10% of the depth of the trench.

The HDP layer is formed to a thickness corresponding to 9~40% of the depth of the trench.

Further, a method for forming an isolation structure of a semiconductor device comprises the steps of forming a hard mask layer on a semiconductor substrate having an active region and a field region, the hard mask comprising a stacked layer of a buffer oxide layer and a pad nitride layer that exposes the field region; defining a trench by etching the exposed field region of the semiconductor substrate using the hard mask as an etch mask; forming an SOG layer in the trench within the range of not completely filling the trench; forming an amorphous aluminum oxide layer on the resultant substrate including the SOG layer; forming an HDP layer on the amorphous aluminum oxide layer to completely fill the trench; subjecting the HDP layer and the amorphous aluminum oxide layer to CMP, thereby exposing the hard mask; removing the hard mask and portions of the amorphous aluminum oxide layer that are formed on both sides of the HDP layer; and crystallizing the amorphous aluminum oxide layer.

After the step of defining a trench and before the step of forming an SOG layer, the method further comprises the steps of forming a wall oxide layer on the surface of the trench; and forming a liner nitride layer on the hard mask including the wall oxide layer.

The SOG layer is formed using any one selected from the group consisting of a per-hydro polysilazane solution, a hydro-silsesquioxane solution, a siloxane solution, and a silanol solution.

The SOG layer is formed to a thickness corresponding to 50~90% of the depth of the trench.

The step of forming an SOG layer comprises the sub steps of forming an SOG layer on the resultant substrate to fill the trench; baking the SOG layer; annealing the baked SOG layer; and etching back the annealed SOG layer such that the SOG layer remains within the range of not completely filling the trench.

The baking step is conducted at a temperature of 100~400° C.

The annealing step is conducted at a temperature of 300~700° C. under an atmosphere selected from the group consisting of $O_2$, $H_2+O_2$, and $H_2O$.

The etching back step is conducted by wet etching using either a diluted HF solution or a diluted BOE solution.

The amorphous aluminum oxide layer is formed to a thickness corresponding to 1~10% of the depth of the trench.

The amorphous aluminum oxide layer is formed with any one selected from the group consisting of ALD, APCVD and MOCVD, at a temperature of 300~600° C., and using any one organic compound selected from the group consisting of $AlCl_3$, $(CH_3)_3AlCl$, $(CH_3)_3Al$, $(C_2H_5)_3Al$, $Al(OC_2H_5)_3$ and $Al(OC_3H_7)_3$ as a source material and any one selected from the group consisting of $O_2$, $O_3$ and $H_2O$ as an oxidant.

The HDP layer is formed to a thickness corresponding to 9~40% of the depth of the trench.

The step of removing the hard mask and portions of the amorphous aluminum oxide layer that are formed on both sides of the HDP layer comprises the sub steps of removing the pad nitride layer of the hard mask; and removing the buffer oxide layer that was exposed due to removal of the pad nitride layer and portions of the amorphous aluminum oxide layer that are formed on both sides of the HDP layer.

The pad nitride layer is removed by wet etching using a phosphoric acid ($H_3PO_4$—$H_2O$) solution, and the buffer oxide layer and the amorphous aluminum oxide layer are removed by wet etching using either a diluted HF solution or a diluted BOE solution.

Crystallization of the amorphous aluminum oxide layer is implemented by any one selected from the group consisting of furnace annealing, RTA and laser annealing.

The annealing process is conducted at a temperature of 750~1,200° C. under at least one atmosphere selected from the group consisting of $N_2$ gas, $O_2$ gas, $H_2$ gas and $H_2O$ gas.

DESCRIPTION OF A SPECIFIC EMBODIMENT

In an embodiment of the present invention, an SOG layer, a crystalline aluminum oxide ($Al_2O_3$) layer, and an HDP layer are sequentially filled in a trench, such that an isolation structure comprises a triple layer composed of these layers. In this case, because the crystalline aluminum oxide layer is not substantially lost even though it is exposed to a wet etching process or a cleaning process when forming a recess gate, the loss of the isolation structure can be minimized.

That is to say, in an embodiment of the present invention, because the isolation structure comprises the triple layer composed of the SOG layer, the aluminum oxide layer and the HDP layer, excessive loss of the isolation structure when forming a recess gate is prevented. Accordingly, the present invention prevents the occurrence of a short circuit between adjoining gates resulting from the excessive loss of the isolation structure. Also, in the present invention, because it is possible to prevent GIDL and parasitic capacitance from increasing due to the excessive loss of the isolation structure, the operation characteristics of a manufactured semiconductor device can be improved, and yield can be increased.

Hereafter, a method for manufacturing an isolation structure of a semiconductor device in accordance with an embodiment of the present invention will be described in detail.

Figure 1A:
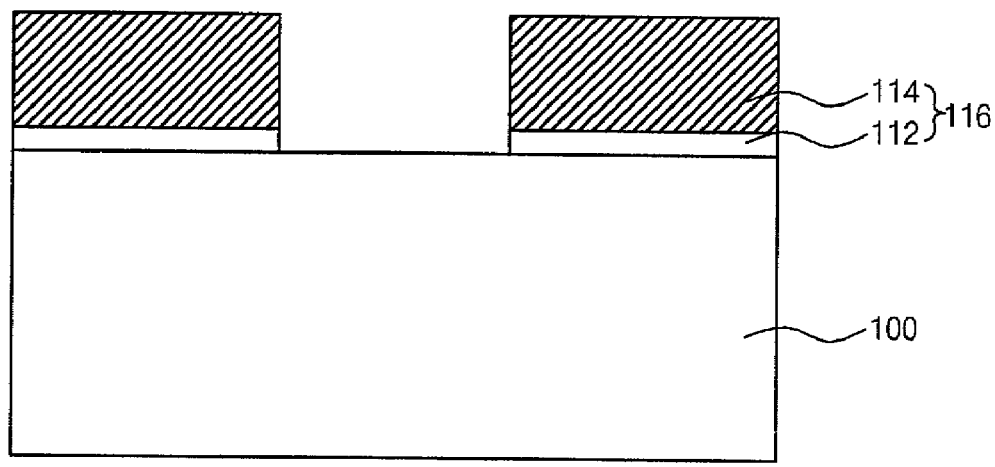
FIGS. 1A through 1D are cross-sectional views explaining a conventional method for forming the isolation structure of a semiconductor device.
Figure 1B:
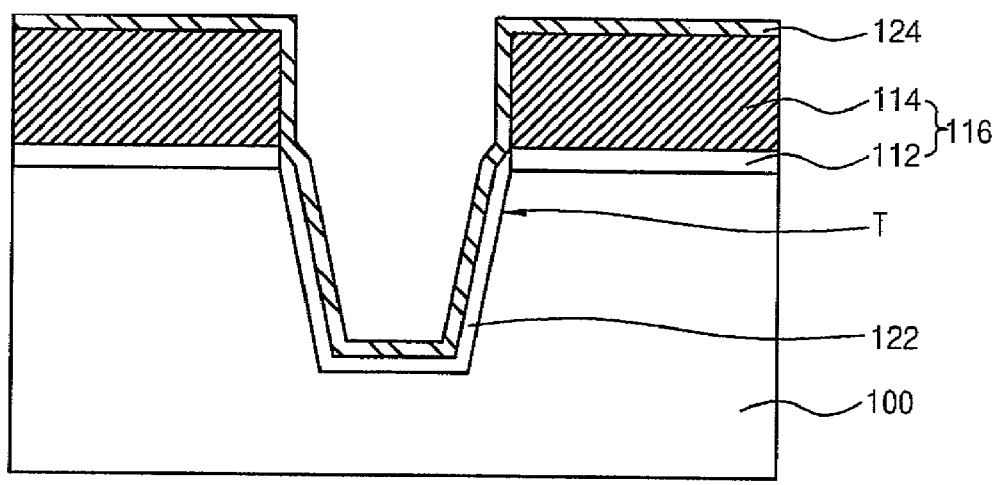
Figure 1C:
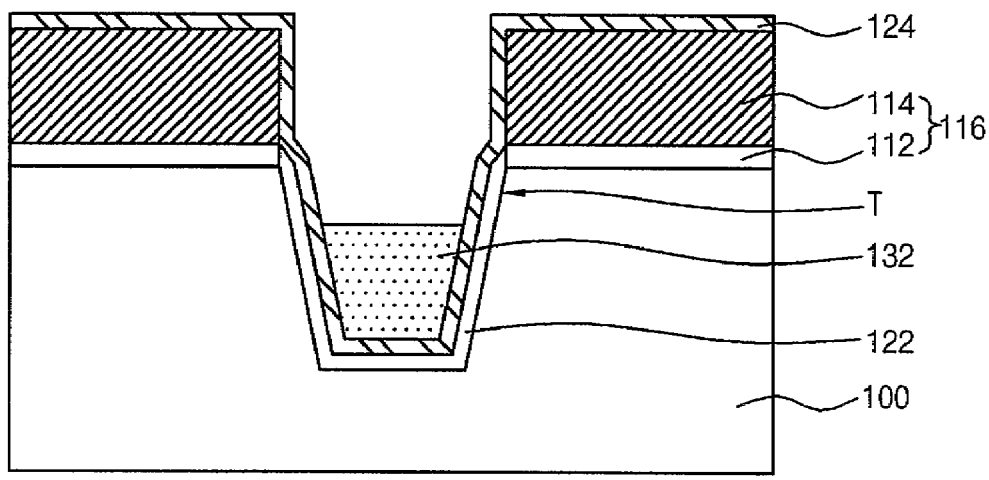
Figure 1D:
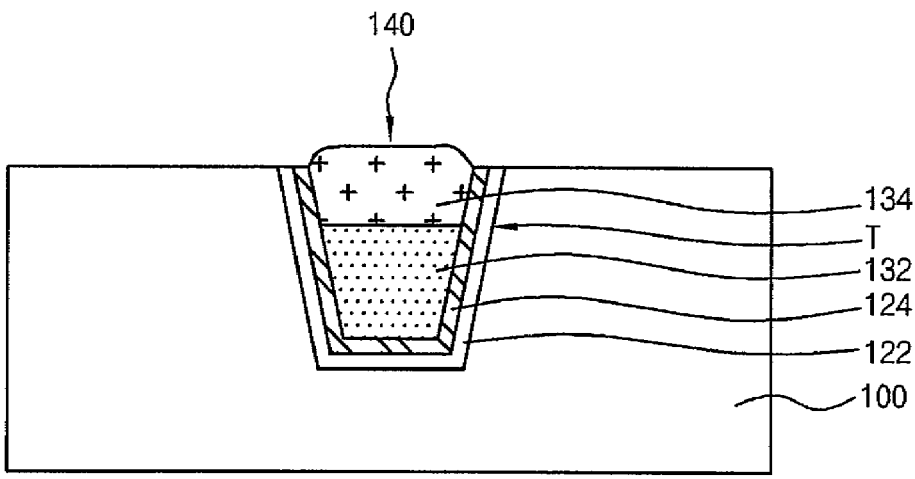
Figure 2:
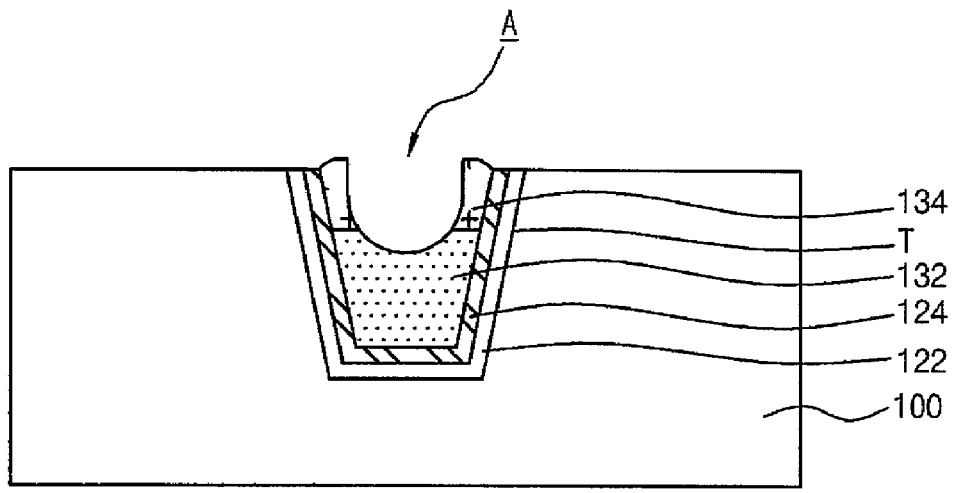
FIG. 2 is a cross-sectional view explaining one defect caused by the conventional art.
Figure 3:
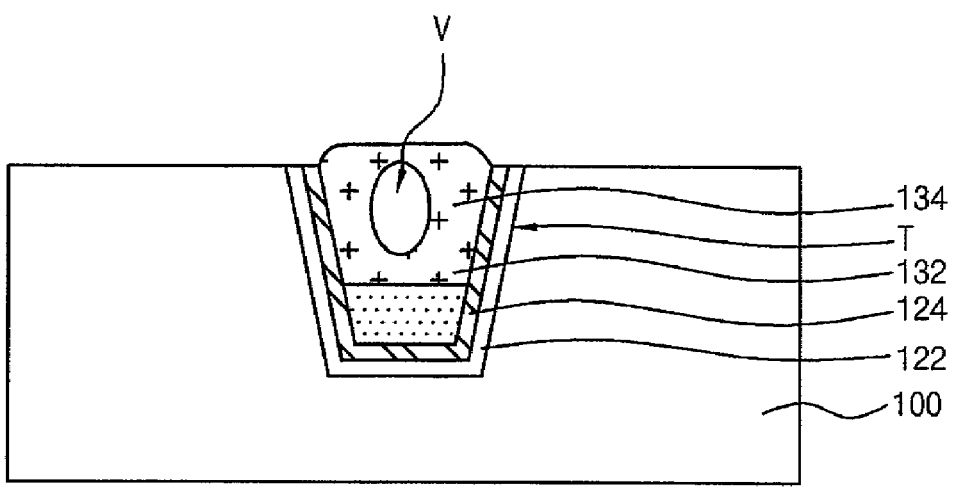
FIG. 3 is a cross-sectional view explaining another defect caused by the conventional art.
Figure 4:
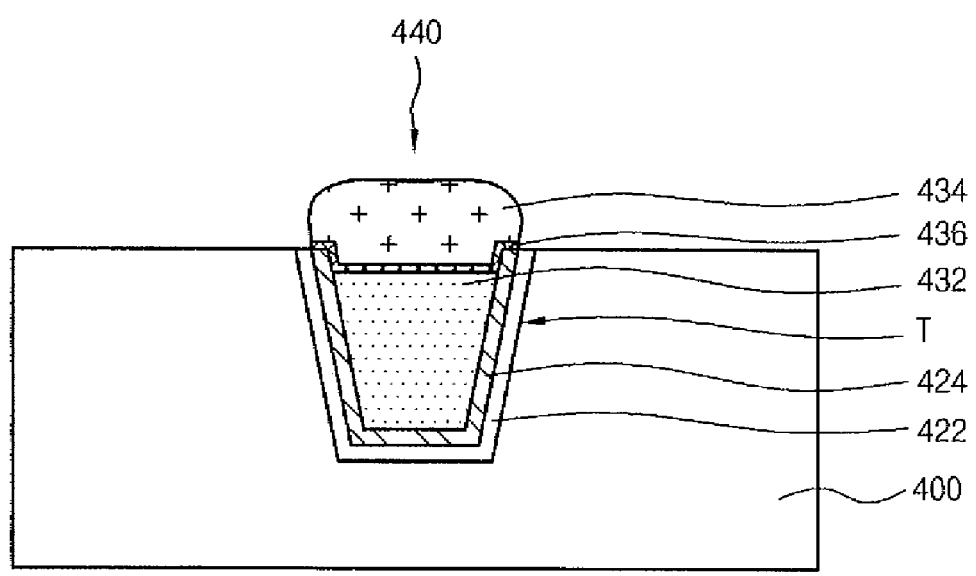
FIG. 4 is a cross-sectional view illustrating the isolation structure of a semiconductor device according to the present invention.

FIG. 4 is a cross-sectional view illustrating the isolation structure of a semiconductor device according to an embodiment of the present invention. An isolation structure 440 delimiting (or defining) an active region is formed on a semiconductor substrate 400. The isolation structure 440 comprises a triple layer composed of an SOG layer 432 that is formed within the range of not completely filling a trench T, an aluminum oxide layer 436 that is formed on the SOG layer 432, and an HDP layer 434 that is formed on the aluminum oxide layer 436 to completely fill the trench T. The reference numeral 422 designates a wall oxide layer, and 424 a liner nitride layer.

The SOG layer 432 is formed to a thickness corresponding to 50~90% of the depth of the trench T, the aluminum oxide layer 436 is formed to a thickness corresponding to 1~10% of the depth of the trench T, and the HDP layer 434 is formed to a thickness corresponding to 9~40% of the depth of the trench T.

The aluminum oxide layer 436 is formed by annealing and thereby crystallizing the amorphous aluminum oxide layer. Since the aluminum oxide layer 436 has a dense crystalline structure, the wet etch rate of the aluminum oxide layer 436 in a diluted HF solution or a diluted BOE ($NH_4+HF$) solution is remarkably low. In other words, the crystalline aluminum oxide layer 436 of the present invention remains substantially intact even when exposed to a diluted HF solution or a diluted BOE solution.

Accordingly, in an embodiment of the present invention, because the isolation structure 440 comprises the triple layer composed of the SOG layer 432, the aluminum oxide layer 436 and the HDP layer 434, the aluminum oxide layer 436 sufficiently serves as an etch barrier during the formation of a recess gate in the semiconductor substrate 400 on which the isolation structure 440 is formed. It is therefore possible to prevent excessive loss of the isolation structure 440. Accordingly, in an embodiment of the present invention, it is possible to avoid occurrence of a short circuit between adjoining gates, and it is possible to prevent an increase in the GIDL on the sidewalls of the isolation structure 440 and parasitic capacitance, whereby the operation characteristics of the semiconductor device can be improved, and yield can be increased.

FIGS. 5A through 5H are cross-sectional views explaining the method for forming the isolation structure of a semiconductor device in accordance with the embodiment of the present invention.

Figure 5A:
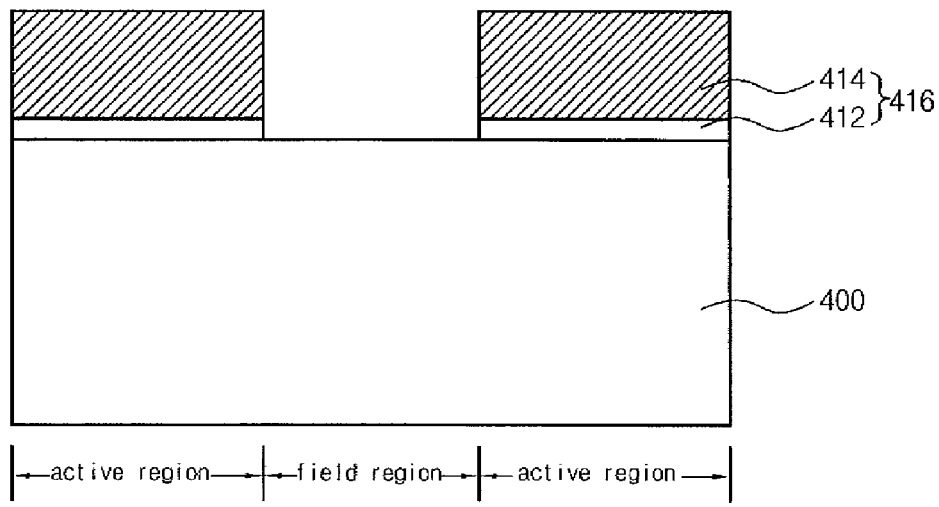
FIGS. 5A through 5H are cross-sectional views explaining a method for forming the isolation structure of a semiconductor device in accordance with an embodiment of the present invention.

Referring to FIG. 5A, a buffer oxide layer 412 and a pad nitride layer 414 are sequentially formed on a semiconductor substrate 400 having an active region and a field region. By etching the pad nitride layer 414 and the buffer oxide layer 412, a hard mask 416 is formed such that the hard mask 416 comprises a stacked layer of the buffer oxide layer 412 and the pad nitride layer 414 and exposes the field region of the semiconductor substrate 400.

Figure 5B:
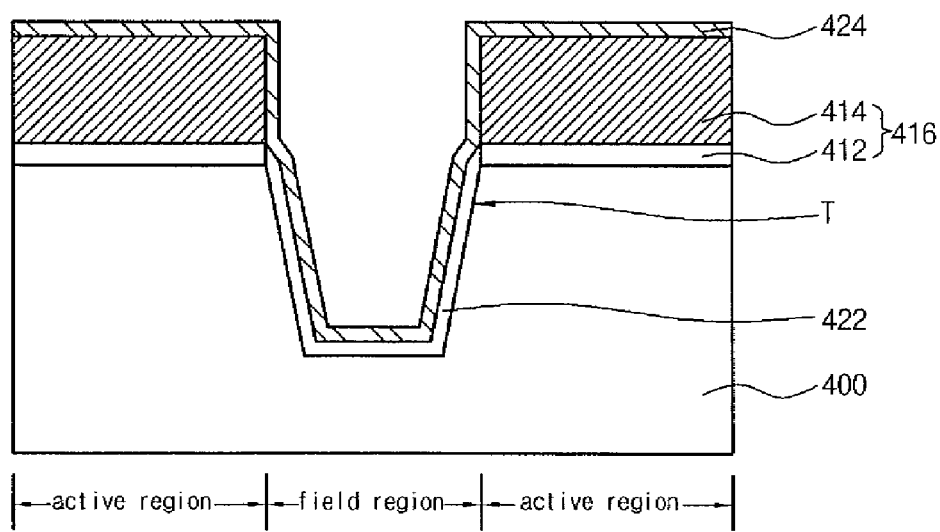

Referring to FIG. 5B, the exposed field region of the semiconductor substrate 400 is dry etched using the hard mask 416 as an etch mask, thereby defining a trench T in the field region. By conducting a wall oxidation process for the resultant substrate 400 formed with the trench T, a wall oxide layer 422 is formed on the surface of the trench T. A liner nitride layer 424 is formed on the hard mask 416 including the wall oxide layer 422.

Figure 5C:
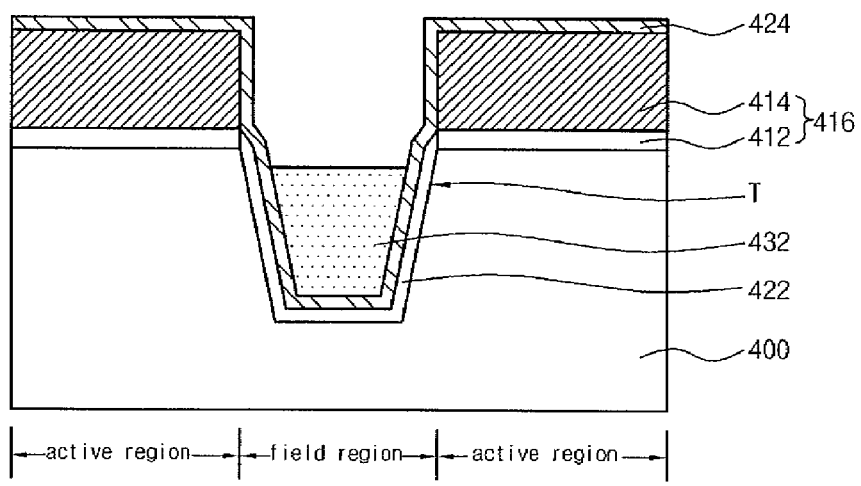

Referring to FIG. 5C, an SOG layer 432 is deposited on the liner nitride layer 424 to fill the trench T. The SOG layer 432 is deposited using a per-hydro polysilazane solution, a hydrosilsesquioxane solution, a siloxane solution, a silanol solution, etc. The SOG layer 432 is baked in an oven or on a hot plate at a temperature of 100~400° C. Then, the baked SOG layer 432 is annealed at a temperature of 300~700° C. under an atmosphere of any one of $O_2$, $H_2+O_2$, or $H_2O$, thereby hardening the baked SOG layer 432. The annealed SOG layer 432 is etched back such that the annealed SOG layer 432 remains at a thickness that does not completely fill the trench T, for example, to a thickness corresponding to 50~90% of the depth of the trench T. At this time, the etch-back process is conducted in a wet etching type using a diluted HF solution or a diluted BOE ($NH_4+HF$) solution.

Figure 5D:
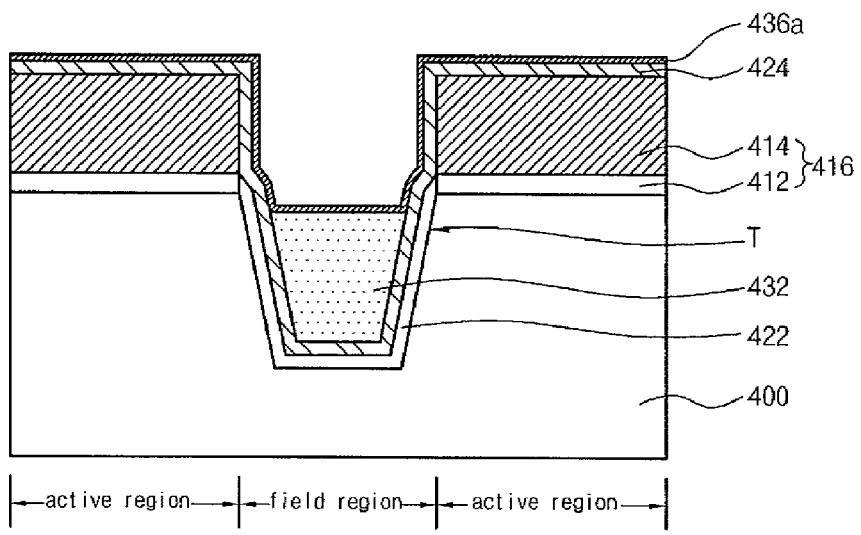

Referring to FIG. 5D, an amorphous aluminum oxide layer 436a is deposited on the remaining SOG layer 432 and the liner nitride layer 424. The amorphous aluminum oxide layer 436a is deposited to a thickness corresponding to 1~10% of the depth of the trench T, for example, to a thickness of 30~300 Å. Also, the amorphous aluminum oxide layer 436a is deposited at a temperature of 300~600° C. through any one of ALD (atomic layer deposition), APCVD (atmospheric pressure chemical vapor deposition) or MOCVD (metal organic chemical vapor deposition). At this time, as an aluminum source material, any one organic compound of $AlCl_3$, $(CH_3)_3AlCl$, $(CH_3)_3Al$, $(C_2H_5)_3Al$, $Al(OC_2H_5)_3$ or $Al(OC_3H_7)_3$ is used, and as an oxidant, any one of $O_2$, $O_3$ or $H_2O$ is used.

Figure 5E:
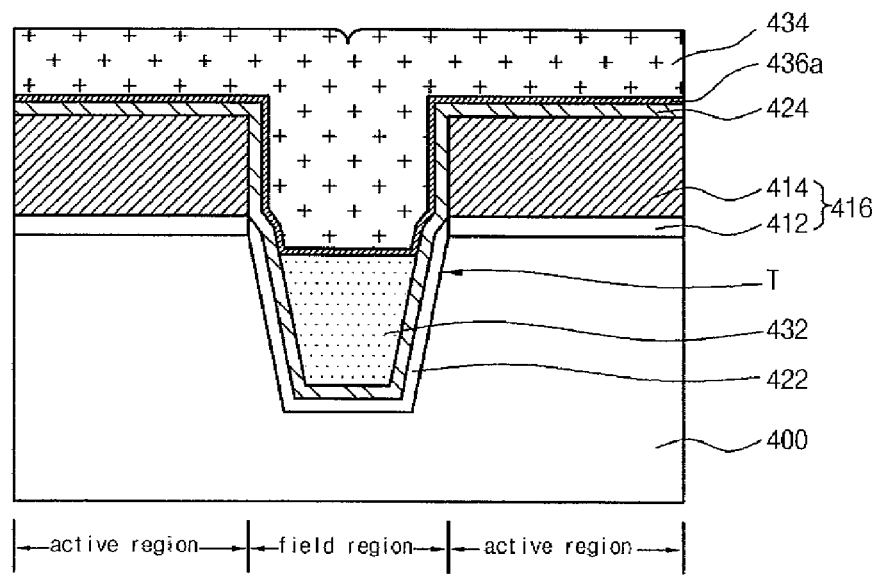

Referring to FIG. 5E, an HDP layer 434 is deposited on the amorphous aluminum oxide layer 436a to a thickness that completely fills the trench T.

Figure 5F:
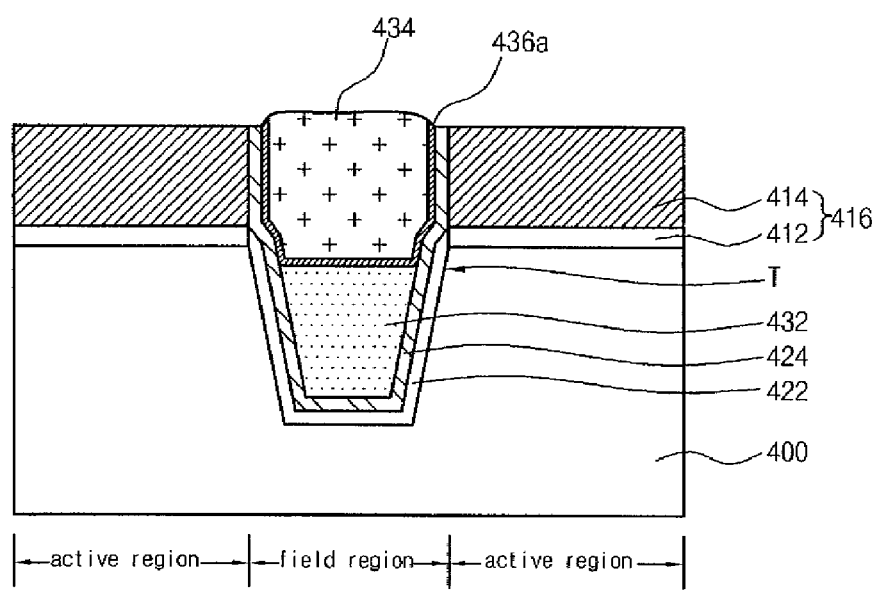

Referring to FIG. 5F, the HDP layer 434 and the amorphous aluminum oxide layer 436 are subjected to CMP such that the hard mask 416 is exposed. As a result of the CMP process, the remaining HDP layer 434 has a thickness corresponding to 9~40% of the depth of the trench T.

Figure 5G:
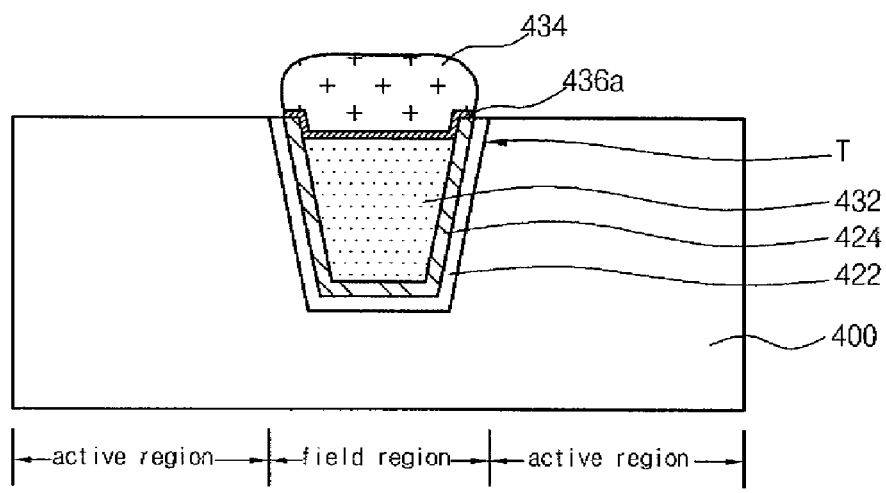

Referring to FIG. 5G, the pad nitride layer 414 of the hard mask 416 is removed through wet etching using a phosphoric acid ($H_3PO_4$—$H_2O$) solution, thereby exposing the buffer oxide layer, and the portions of the amorphous aluminum oxide layer 436a that are formed on both sides of the HDP layer 434 are removed through wet etching using a diluted HF solution or a diluted BOE ($NH_4+HF$) solution.

Figure 5H:
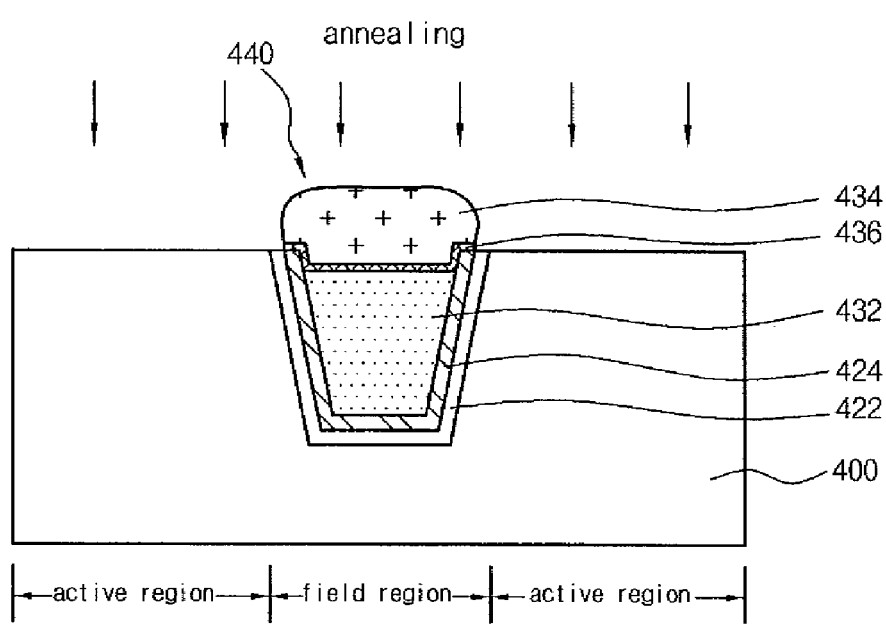

Referring to FIG. 5H, by annealing the resultant substrate 440 from which the hard mask 416 and the portions of the amorphous aluminum oxide layer 436a are removed, the amorphous aluminum oxide layer 436a is crystallized, and a crystalline aluminum oxide layer 436 is obtained. As a result, an isolation structure 440, which comprises a triple layer composed of the SOG layer 432, the crystalline aluminum oxide layer 436 and the HDP layer 434, is formed. Here, the annealing that forms the crystalline aluminum oxide layer 436 is implemented as any one of furnace annealing, RTA (rapid thermal annealing) or laser annealing under at least one atmosphere of $N_2$ gas, $O_2$ gas, $H_2$ gas or $H_2O$ gas at a temperature of 750~1,200° C.

The crystalline aluminum oxide layer 436 obtained as a result of the annealing has a dense structure, and, since the grain is increased in the course of annealing, the etching speed of the crystalline aluminum oxide layer 436 in a diluted HF solution or a diluted BOE solution is dramatically decreased when compared to that of the amorphous aluminum oxide layer. Consequently, the crystalline aluminum oxide layer 436 is not etched and remains substantially intact during a subsequent wet etching process.

Therefore, in the present invention, because the isolation structure 440 comprises the triple layer composed of the SOG layer 432, the crystalline aluminum oxide layer 436 and the HDP layer 434, the crystalline aluminum oxide layer 436 sufficiently serves as an etch barrier when subsequently forming a recess gate, thereby ensuring that the SOG layer 432 is not exposed. Hence, because it is possible to prevent exposure of the SOG layer 432, which has a markedly rapid etching speed, the excessive loss thereof can be avoided.

Figure 6:
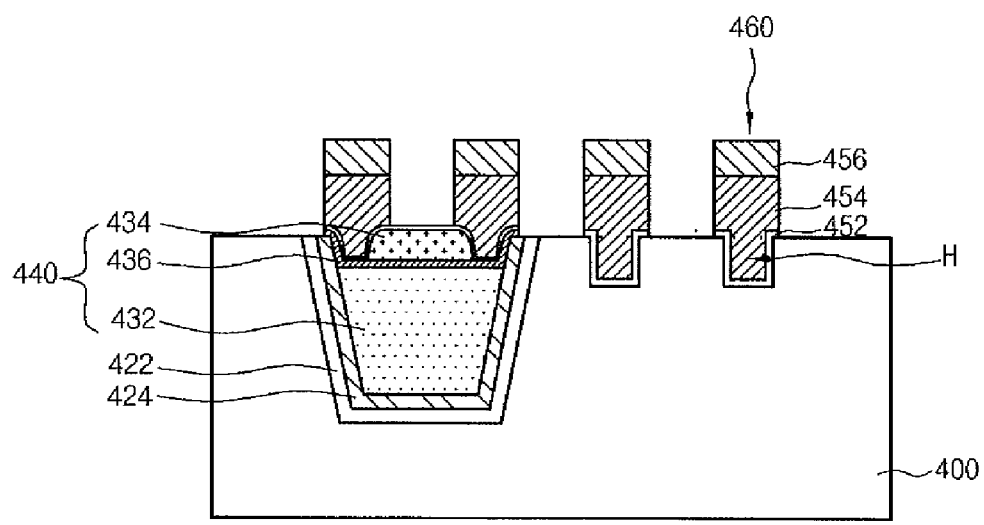
FIG. 6 is a cross-sectional view explaining the effects of the present invention.

More concretely speaking, FIG. 6 is a cross-sectional view explaining the effects of the present invention. When defining a groove H for a recess gate by etching the gate forming area of the semiconductor substrate 400 that is formed with the isolation structure 440 comprising the triple layer, because the aluminum oxide layer 436 serves as an etch barrier, exposure of the SOG layer 432 under the aluminum oxide layer 436 is prevented. As a result, in the present invention, because it is possible to prevent exposure of the SOG layer 432 having a markedly rapid etching speed in a diluted HF solution or a diluted BOE solution, excessive loss of the isolation structure 440 is thereby avoided.

In FIG. 6, the unexplained reference numeral 452 designates a gate insulation layer, 454 a gate conductive layer, 456 a hard mask layer, and 460 a recess gate.

As is apparent from the above description, when forming the isolation structure of a semiconductor device according to the present invention, because the isolation structure comprises a triple layer composed of an SOG layer, a crystalline aluminum oxide layer, and an HDP layer, when etching is conducted to define a groove for a recess gate, the undesired loss of the isolation structure can be minimized. Therefore, in the present invention, as the excessive loss of the isolation structure is avoided, it is possible to prevent the occurrence of a short circuit between adjoining gates, to improve GIDL characteristics, and to prevent parasitic capacitance from being increased, whereby yield can be increased and the operation characteristics of a semiconductor device can be improved. Moreover, in the present invention, because the aluminum oxide layer is used as an etch barrier so as to prevent excessive loss of the isolation structure, the filling thickness of the SOG layer, which has an excellent gap fill characteristic, can be increased when compared to the conventional art. Thus, since trench filling can be easily implemented, it is possible to prevent the formation of a void in the isolation structure, thereby improving the reliability of the isolation structure.

Although a specific embodiment of the present invention has been described for illustrative purposes, those skilled in the art will appreciate that various modifications, additions and substitutions are possible, without departing from the scope and the spirit of the invention as disclosed in the accompanying claims.

What is claimed is:

1. A method of forming an isolation structure of a semiconductor device, the method comprising the steps of:
   forming a hard mask layer on a semiconductor substrate having an active region and a field region, wherein the hard mask exposes the field region;
   forming a trench by etching the exposed field region of the semiconductor substrate using the hard mask as an etch mask;
   forming an spin on glass (SOG) layer in a portion of the trench to partially fill the trench;
   forming an amorphous aluminum oxide layer at least on the SOG layer;
   forming a high density plasma (HDP) layer on the amorphous aluminum oxide layer to completely fill the trench;
   chemical mechanical polishing any HDP layer and any amorphous aluminum oxide layer on the hard mask to expose the hard mask;
   removing the hard mask and portions of the amorphous aluminum oxide layer that are formed on the HDP layer; and
   crystallizing the amorphous aluminum oxide layer.

2. The method of claim 1, further comprising, after the step of forming the trench and before the step of forming the SOG layer of:
   forming a wall oxide layer on the surface of the trench; and
   forming a liner nitride layer on the hard mask including the wall oxide layer.

3. The method of claim 1, wherein the SOG layer is formed by using one of a per-hydro polysilazane solution, a hydrosilsesquioxane solution, a siloxane solution, and a silanol solution.

4. The method of claim 1, wherein the SOG layer is formed to a thickness to fill 50~90% of the total depth of the trench.

5. The method of claim 1, wherein the step of forming an SOG layer comprises the sub steps of:
   forming an SOG layer on the resultant substrate to fill the trench;
   baking the SOG layer;
   annealing the baked SOG layer; and
   etching back the annealed SOG layer such that the SOG layer partially fills the trench.

6. The method of claim 5, wherein the baking step is conducted at any temperature in the range of 100~400° C.

7. The method of claim 5, wherein the annealing step is conducted at any temperature in the range of 300~700° C. under an atmosphere selected from the group consisting of $O_2$, $H_2+O_2$, and $H_2O$.

8. The method of claim 5, wherein the etching-back step is conducted by wet etching using either a diluted HF solution or a diluted BOE solution.

9. The method of claim 1, wherein the amorphous aluminum oxide layer is formed to a thickness in the range of 1~10% of the total depth of the trench.

10. The method of claim 1, wherein the amorphous aluminum oxide layer is formed through any one selected from the group consisting of ALD, APCVD and MOCVD at a temperature in the range of 300~600° C. using any one organic compound selected from the group consisting of $AlCl_3$, $(CH_3)_3$ AlCl, $(CH_3)_3Al$, $(C_2H_5)_3Al$, $Al(OC_2H_5)_3$ and $Al(OC_3H_7)_3$ as a source material and any one selected from the group consisting of $O_2$, $O_3$ and $H_2O$ as an oxidant.

11. The method of claim 1, wherein the HDP layer is formed to a thickness in the range of 9~40% of the total depth of the trench.

12. The method according to claim 1, wherein the hard mask is made of a stacked layer of a buffer oxide layer and a pad nitride layer.

13. The method according to claim 12, wherein the step of removing the hard mask and portions of the amorphous aluminum oxide layer that are formed on the HDP layer comprises the sub steps of:
   removing the pad nitride layer of the hard mask; and
   removing the buffer oxide layer exposed due to removal of the pad nitride layer, and portions of the amorphous aluminum oxide layer that are formed on the HDP layer.

14. The method of claim 13, wherein the pad nitride layer is removed through wet etching using a phosphoric acid ($H_3PO_4$—$H_2O$) solution, and the buffer oxide layer and the amorphous aluminum oxide layer are removed through wet etching using any one selected from the group consisting of a diluted HF solution and a diluted BOE solution.

15. The method of claim 1, wherein crystallization of the amorphous aluminum oxide layer is implemented through any one of furnace annealing, RTA and laser annealing.

16. The method of claim 15, wherein the annealing process is conducted under at least one atmosphere selected from the group consisting of $N_2$ gas, $O_2$ gas, $H_2$ gas and $H_2O$ gas at any temperature in the range of 750~1,200° C.

* * * * *